United States Patent
Lee et al.

(10) Patent No.: US 6,828,229 B2
(45) Date of Patent: Dec. 7, 2004

(54) METHOD OF MANUFACTURING INTERCONNECTION LINE IN SEMICONDUCTOR DEVICE

(75) Inventors: Soo-geun Lee, Suwon (KR); Hong-jae Shin, Seoul (KR); Kyoung-woo Lee, Seoul (KR); Jae-hak Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/081,661

(22) Filed: Feb. 22, 2002

(65) Prior Publication Data

US 2002/0168849 A1 Nov. 14, 2002

(30) Foreign Application Priority Data

May 10, 2001 (KR) .......................................... 2001-25573

(51) Int. Cl.[7] .................... H01L 21/4763; H01L 21/302
(52) U.S. Cl. ...................... 438/638; 438/635; 438/706; 438/738
(58) Field of Search ................................ 438/637–640, 438/706, 634, 745, 738, 724

(56) References Cited

U.S. PATENT DOCUMENTS

| | | | |
|---|---|---|---|
| 5,989,997 A | 11/1999 | Lin et al. ..................... 438/622 |
| 6,057,239 A | 5/2000 | Wang et al. ................. 438/689 |
| 6,093,966 A * | 7/2000 | Venkatraman et al. ...... 257/751 |
| 6,221,759 B1 * | 4/2001 | Bothra et al. | |
| 6,319,815 B1 * | 11/2001 | Iguchi et al. ................ 438/624 |
| 6,323,121 B1 * | 11/2001 | Liu et al. | |
| 6,352,945 B1 | 3/2002 | Matsuki et al. ............. 438/778 |
| 6,383,955 B1 | 5/2002 | Matsuki et al. ............. 438/790 |
| 6,391,761 B1 * | 5/2002 | Lui | |
| 6,410,463 B1 | 6/2002 | Matsuki ....................... 438/790 |
| 6,432,846 B1 | 8/2002 | Matsuki ....................... 438/790 |
| 6,455,445 B2 | 9/2002 | Matsuki ....................... 438/789 |
| 6,465,358 B1 * | 10/2002 | Nashner et al. | |
| 6,514,880 B2 | 2/2003 | Matsuki et al. ............. 438/780 |
| 6,559,520 B2 | 5/2003 | Matsuki et al. ............. 257/642 |
| 2001/0046778 A1 | 11/2001 | Wang et al. | |

FOREIGN PATENT DOCUMENTS

KR        00-0029195        5/2000    ............ C09K/3/10

* cited by examiner

Primary Examiner—Ha Tran Nguyen
(74) Attorney, Agent, or Firm—Mills & Onello, LLP

(57) ABSTRACT

A method of forming an interconnection line in a semiconductor device is provided. A first etching stopper is formed on a lower conductive layer which is formed on a semiconductor substrate. A first interlayer insulating layer is formed on the first etching stopper. A second etching stopper is formed on the first interlayer insulating layer. A second interlayer insulating layer is formed on the second etching stopper. The second interlayer insulating layer, the second etching stopper, and the first interlayer insulating layer are sequentially etched using the first etching stopper as an etching stopping point to form a via hole aligned with the lower conductive layer. A protective layer is formed to protect a portion of the first etching stopper exposed at the bottom of the via hole. A portion of the second interlayer insulating layer adjacent to the via hole is etched using the second etching stopper as an etching stopping point to form a trench connected to the via hole. The protective layer is removed. The portion of the first etching stopper positioned at the bottom of the via hole is removed. An upper conductive layer that fills the via hole and the trench and is electrically connected to the lower conductive layer is formed.

18 Claims, 8 Drawing Sheets

METHOD OF MANUFACTURING INTERCONNECTION LINE IN SEMICONDUCTOR DEVICE

BACKGROUND OF THE INVENTION

1. Field of the Invention

The present invention relates to a method of manufacturing a semiconductor device, and more particularly, to a method of manufacturing an interconnection line in a semiconductor device when using a material having a low dielectric constant in the semiconductor device.

2. Description of the Related Art

In order to overcome reduction in the speed of semiconductor devices due to RC delay between interconnection lines, an attempt to adopt copper (Cu) lines in semiconductor devices has been made. Also, an attempt to use a material having a low dielectric constant for an insulating layer insulating adjacent interconnection lines from each other has been made. In such structures, there is a tendency to pattern interconnection lines made of copper (Cu) by a patterning method known as a dual damascene process.

A variety of approaches are proposed for the dual damascene process and basically include methods of introducing insulating layers formed of double or multi-layers and etching stoppers on the interface or bottom of the insulating layers. When forming trenches, which define the shape of interconnection lines, in the insulating layers, the etching stoppers are introduced to stop the etching process used in forming the trenches.

If the insulating layers used to insulate adjacent interconnection lines from each other are formed of a material having a low dielectric constant as described above, the etch selectivity of the etching stopper with respect to the insulating layers is poor in the etching process used in forming the trenches. The poor etch selectivity of the etching stopper with respect to the material having a low dielectric constant results in over-etching the etching stoppers covering a lower layer during the etching process of forming a via hole and/or a trench in interlayer insulting layers.

For example, an etching stopper covering a lower interconnection line is over-etched during an etching process used in forming a via hole. As a result, the upper surface of the lower interconnection line may be exposed or recessed during a subsequent etching process used in forming a trench. That is, the lower interconnection line is damaged by the dual damascene process.

FIGS. 1 through 5 are cross-sectional views showing the steps of forming an interconnection line by a conventional dual damascene process. Referring to FIG. 1, a first etching stopper 40 and a first interlayer insulating layer 50 are sequentially formed over a semiconductor substrate 10. Here, the first etching stopper 40 covers a lower conductive layer 30. The lower conductive layer 30 may be a lower interconnection line and is insulated by a lower insulating layer 20. The lower conductive layer 30 may be electrically connected to an operating device or a transistor formed in the semiconductor substrate 10. A second etching stopper 45 is formed on the first interlayer insulating layer 50. A second interlayer insulating layer 55 is formed on the second etching stopper 45.

Referring to FIG. 2, a first etching mask 60, e.g., a photoresist pattern, is formed on the second interlayer insulating layer 55. A portion exposed by the first etching mask 60 is etched to form a via hole 71. Here, it is preferable that an etching process for forming the via hole 71 stops on a portion of the first etching stopper 40 over the lower conductive layer 30. The first etching mask 60 is then removed.

Referring to FIG. 3, a second etching mask 65, e.g., a photoresist pattern, is formed on the second interlayer insulating layer 55. A region exposed by the second etching mask is generally wider than the region exposed by the first etching mask 60.

Referring to FIG. 4, a portion of the second interlayer insulating layer 55 exposed by the second etching mask 65 is etched to form a trench 75 which is connected to the via hole 71. An etching process of patterning the exposed portion of the second interlayer insulating layer 55 to form the trench 75 uses the second etching stopper 45 as an etching stopping point. The etching process of forming the trench 75 is performed after the via hole 71 is formed and thus etches the upper surface of the first etching stopper 40 exposed by the via hole 71.

Silicon nitride (SiN) or silicon carbide (SiC) used as the first etching stopper 40 may show a poor etch selectivity with respect to the carbon-doped material having a low dielectric constant if the first interlayer insulating layer 50 and/or the second interlayer insulating layer 55 is formed of a material having a lower dielectric constant, e.g., a carbon-doped material having a low dielectric constant such as a carbon-doped silicon oxide (SiOC), to overcome RC delay. Thus, the exposed portion of the first etching stopper 40 may be removed entirely by the etching process of forming the trench 75 by which the upper surface of the lower conductive layer 30, which must be protected by the first etching stopper 40, may be exposed.

As described above, the lower interconnection line made of copper (Cu) is damaged if the lower conductive layer 30, e.g., a lower interconnection line, is exposed to the etching process. Also, after forming the trench 75, the photoresist pattern used as the second etching mask 65 is removed by ashing and stripping. Ashing is performed using oxygen plasma but the lower interconnection line is greatly recessed or damaged by oxygen plasma if the lower interconnection line is already exposed. Thus, referring to FIG. 5, if the lower interconnection line is damaged, when forming an upper conductive layer 80 filling the trench 75 and the via hole 71, e.g., an upper copper line, poor contact between an upper interconnection line and the lower interconnection line may occur.

Accordingly, as described above, insulating layers, etching stoppers, and a poor etch selectivity resulting from a dual damascene process may cause defective semiconductor devices, e.g., a damaged lower interconnection line.

SUMMARY OF THE INVENTION

To solve the above-described problems, it is an object of the present invention to provide a method of forming an interconnection line in a semiconductor device which can prevent a lower conductive layer from being damaged during a dual damascene process of forming a via hole and a trench.

The invention is directed to a method of forming an interconnection line in a In semiconductor device. In accordance with the method, a first etching stopper is formed on a lower conductive layer which is formed on a semiconductor substrate. A first interlayer insulating layer is formed on the first etching stopper. A second etching stopper is formed on the first interlayer insulating layer. A second interlayer insulating layer is formed on the second etching stopper. The second interlayer insulating layer, the second etching stopper, and the first interlayer insulating layer are sequentially etched using the first etching stopper as an etching stopping point to form a via hole aligned with the lower conductive layer. A protective layer is formed to protect a portion of the first etching stopper exposed at the bottom of the via hole. A portion of the second interlayer insulating layer adjacent to the via hole is etched using the second etching stopper as an etching stopping point to form a trench connected to the via hole. The protective layer is removed. The portion of the first etching stopper positioned at the bottom of the via hole is removed. An upper conductive layer that fills the via hole and the trench and is electrically connected to the lower conductive layer is formed. The lower conductive layer or the upper conductive layer may include a copper layer. The first etching stopper and/or the second etching stopper may be formed of silicon nitride or silicon carbide.

The first interlayer insulating layer and/or the second interlayer insulating layer may be formed of a material having a low dielectric constant such as carbon-doped silicon oxide (SiOC).

The protective layer may include a nonorganic spin-on dielectric (SOD) layer such as a Hydrogen silisesQuioxane (HSQ) layer.

In one embodiment, the step of forming the protective layer includes a step of forming the protective layer on the second interlayer insulating layer to fill the via hole and a step of etching back the protective layer so that the upper surface of the protective layer is lower than the upper surface of the second interlayer insulating layer. Here, the etch back may be performed by a wet etching method using a resist developer containing a tetramethyl ammonium hydroxide aqueous solution. The etch back may be performed by a wet etching method using a HF solution diluted with water.

The protective layer may be removed by a wet etching method using a resist developer containing a tetramethyl ammonium hydroxide aqueous solution. The protective layer may be removed by a wet etching method using a HF solution diluted with water.

When an interconnection line in a semiconductor device is formed by a dual damascene process, a lower conductive layer can be prevented from being damaged.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

In an embodiment of the present invention, there is provided a method of effectively preventing a lower interconnection line or a lower conductive layer from being damaged during a dual damascene process by fully protecting the lower interconnection line or the lower conductive layer when forming an interconnection line using the dual damascene process. In accordance with the invention, a protective layer is introduced to protect an etching stopper remaining after a via hole is formed so that the remaining etching stopper can protect the lower conductive layer or the lower interconnection line. In one embodiment, the protective layer is a nonorganic spin-on-dielctric (SOD) layer. Using the nonorganic SOD layer as a protective layer prevents an interlayer insulating layer comprised of a material having a low dielectric constant from being affected by the protective layer.

FIGS. 6 through 14 are cross-sectional views showing steps of forming an interconnect line in a semiconductor device according to an embodiment of the present invention.

Figure 1:
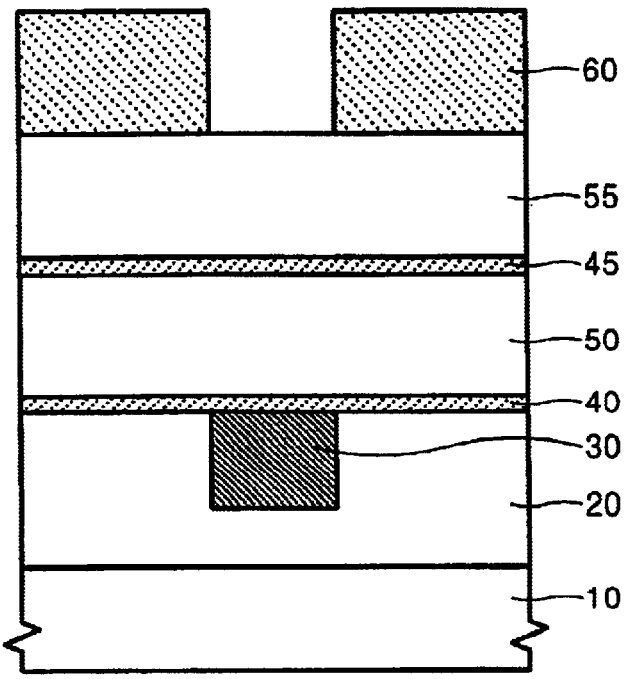
FIGS. 1 through 5 are cross-sectional views showing steps of forming an interconnection line by a dual damascene process according to the prior art.
Figure 2:
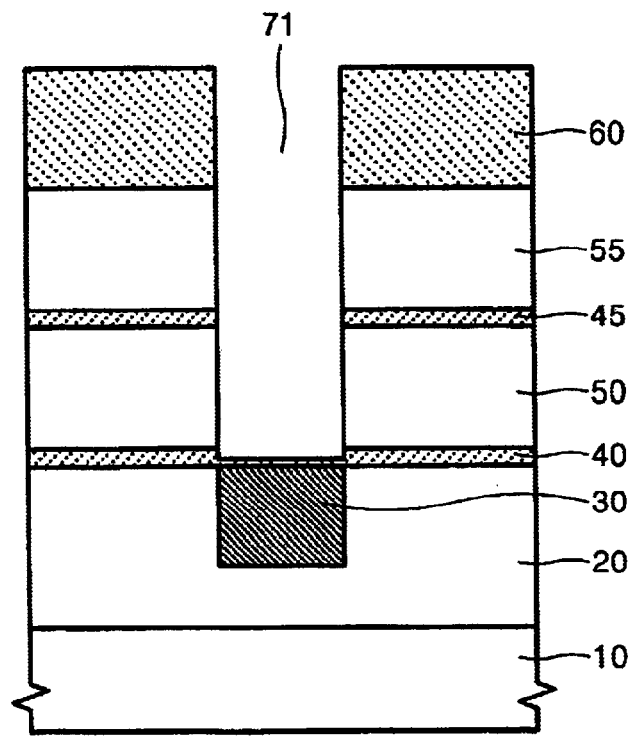
Figure 3:
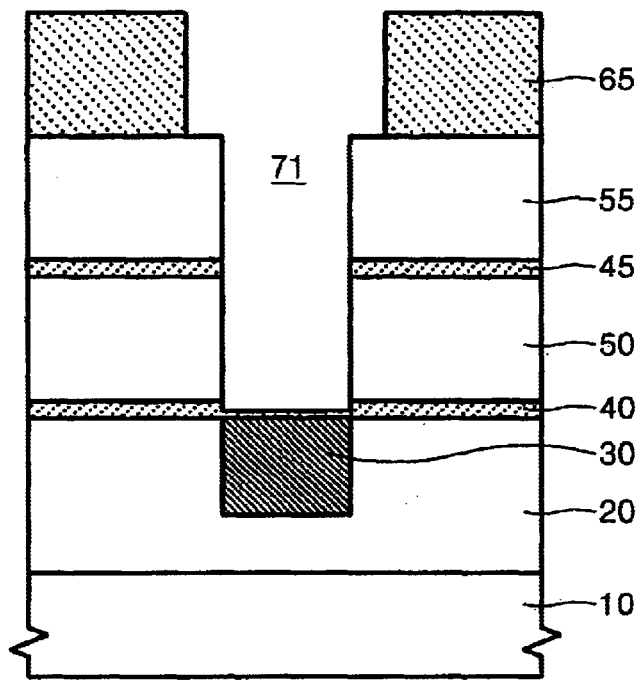
Figure 4:
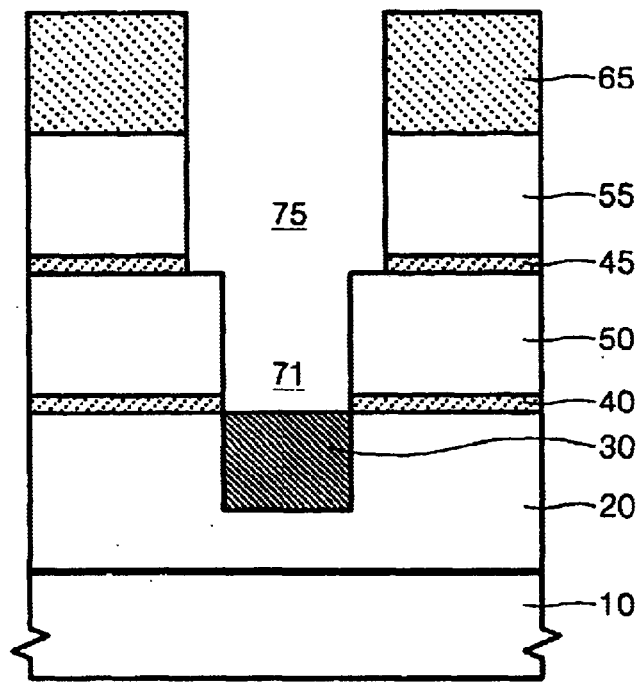
Figure 5:
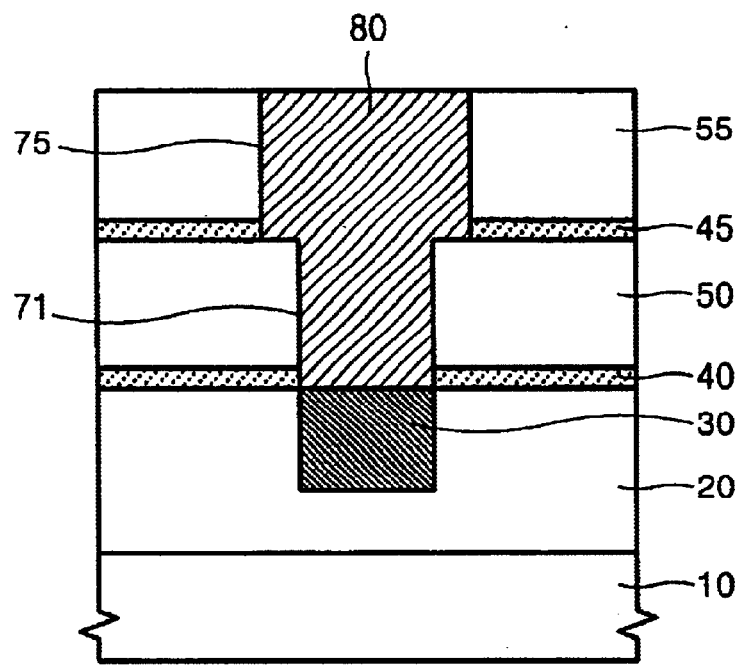
Figure 6:
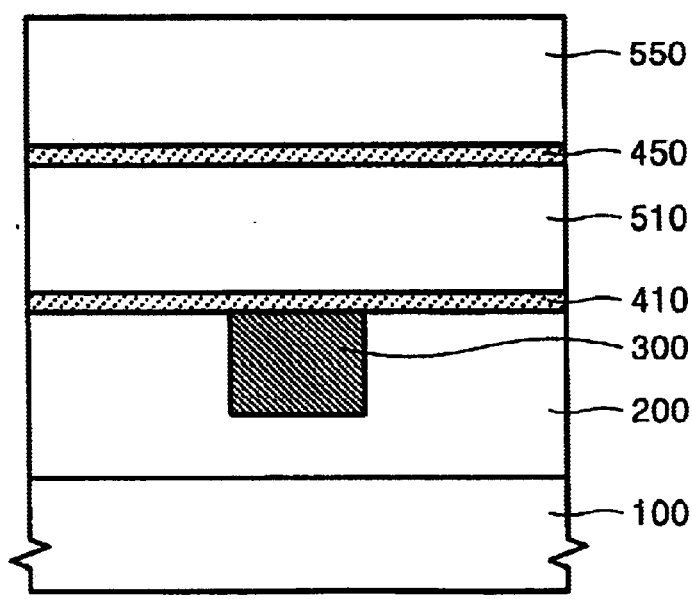
FIGS. 6 through 14 are cross-sectional views showing steps of forming an interconnect line in a semiconductor device according to an embodiment of the present invention.

FIG. 6 shows the steps of forming interlayer insulating layers 510 and 550 over a semiconductor substrate 100. In detail, a first etching stopper 410 is formed over the semiconductor substrate 100. A first interlayer insulating layer 510 is formed on the first etching stopper 410. Here, the first etching stopper 410 covers a lower conductive layer 300. The lower conductive layer 300 may be a lower interconnection line or a conductive region in the semiconductor substrate 100. The lower conductive layer 300 is insulated by a lower insulating layer 200 formed of silicon oxide. The lower conductive layer 300 may be electrically connected to an operating device or a transistor formed in the semiconductor substrate 100. The lower conductive layer may be comprised of a variety of metal layers including, in one embodiment, a copper layer.

The first etching stopper 410, which covers the lower conductive layer 300, is used as an etching stopping point in a subsequent etching process used to pattern the first interlayer insulating layer 510. Thus, the first etching stopper 410 is formed of a material having an excellent etch selectivity to a material of which the first interlayer insulating layer 510 is formed. For example, the first etching stopper 410 can be formed of silicon carbide (SiC) or silicon nitride which has an excellent etch selectivity to the silicon oxide used to form the lower insulating layer 200.

The first interlayer insulating layer 510 is formed on the first etching stopper 410. The first interlayer insulating layer 510 may insulate adjacent conductive layers which will be used as interconnection lines. The first interlayer insulating layer 510 may be formed of a variety of silicon oxide-family dielectric materials and is preferably formed of a material having a low dielectric constant to overcome limitations on the high-speed operation of semiconductor devices such as RC delay. The first interlayer insulating layer 510 may be formed of a carbon-doped silicon oxide (SiOC).

A second etching stopper 450 is formed on the first interlayer insulating layer 510. The second etching stopper 450 is used as an etching stopping point in a subsequent etching process used to pattern the second interlayer insulating layer 550. Thus, the second etching stopper 450 is formed of a material having an excellent etch selectivity to a material of which the second interlayer insulating layer 550 is formed. For example, the second etching stopper 450 is formed of silicon carbide (SiC) or silicon nitride (SiN), which has an excellent etch selectivity to silicon oxide.

A second interlayer insulating layer 550 is formed on the second etching stopper 450. The second interlayer insulating layer 550 as well as the first interlayer insulating layer 510 may insulate adjacent conductive layers which will be used as interconnection lines. The second interlayer insulating layer 550 may be formed of a variety of silicon oxide-family dielectric materials and is preferably formed of a dielectric material having a low dielectric constant to overcome limitations on the high speed-operation of semiconductor devices such as RC delay. The second interlayer insulating layer 550 may be formed of carbon-doped silicon oxide (SiOC).

Figure 7:
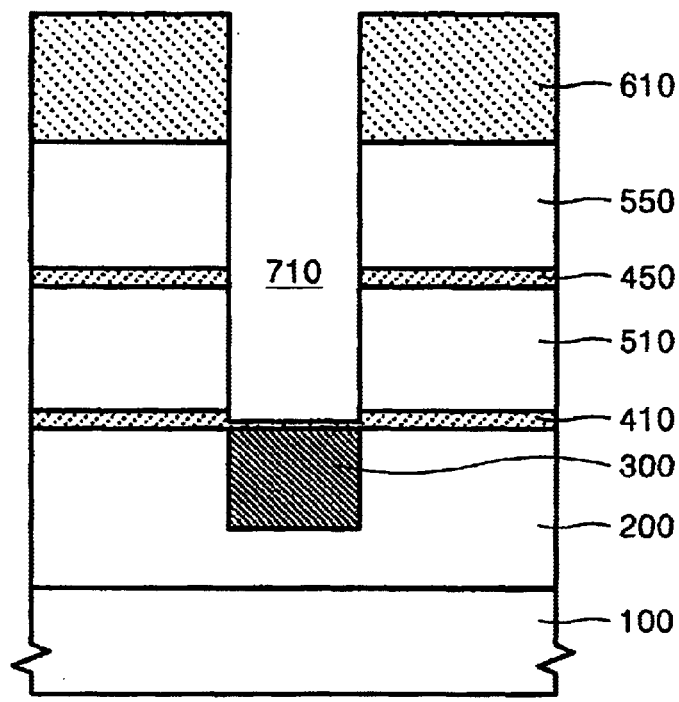

FIG. 7 shows the steps of forming a via hole 710 aligned with the lower conductive layer 300. In detail, a first etching mask 610, e.g., a photoresist pattern, is formed on the second interlayer insulating layer 550. A portion of the second interlayer insulating layer 550 exposed by the first etching mask 610 is etched. This etching process also etches the second etching stopper 450 and the first interlayer insulating layer 510 underneath the second interlayer insulating layer 550 and stops at the first etching stopper 410, which acts as an etching stopping point. The via hole 710, which is aligned with the lower conductive layer 300, is formed by the etching process.

The via hole 710 may be formed by a dry etching process using a gas for etching silicon oxide. For example, the via hole 710 may be formed by a dry etching process using a reaction gas containing $C_xF_yH_z$-family gas (x, y, and z are arbitrary integers). Here, the reaction gas may further contain oxygen gas ($O_2$), nitrogen gas ($N_2$) and/or argon gas (Ar).

Thus, it is preferable that the first etching stopper 410 prevents the lower conductive layer 300 from being damaged in a subsequent process. However, if the etch selectivity of the first etching stopper 410 and the interlayer insulating layers 510 and 550 is not high, a portion of the first etching stopper 410 is etched during the etching process of forming the via hole 710. Thus, the first etching stopper 410 may be slightly recessed. Here, it is preferable that the first etching stopper 410, which covers the lower conductive layer 300, has a remaining thickness and does not expose the upper surface of the lower conductive layer 300. The photoresist pattern used as the first etching mask 610 is removed by ashing.

Figure 8:
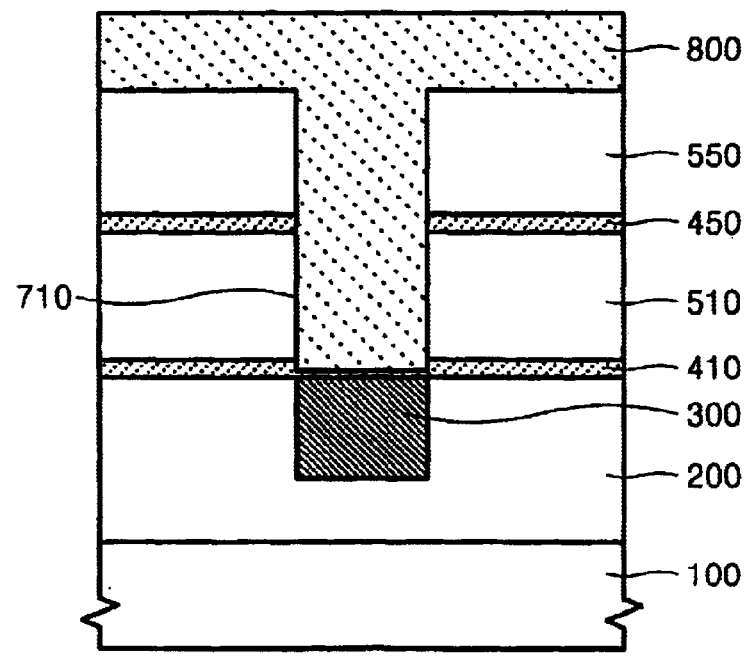

FIG. 8 shows the steps of forming a protective layer 800 filling the via hole 710. In detail, the protective layer 800 filling the via hole 700 is formed on the second interlayer insulating layer 550. The protective layer 800 prevents the upper surface of the lower conductive layer 300 from being exposed due to the removal of the first etching stopper 410. The protective layer 800 may be formed of a variety of materials. In one embodiment of the present invention, it is formed of nonorganic SOD. For example, the protective layer 800 can be formed of hydrogen silsesquioxane (HSQ). It is preferable that the deposited HSQ layer is soft baked. For example, the HSQ layer is soft baked at a temperature of about 400° C., preferably about 200° C., for about 1–5 minutes. After soft baking, a hard bake may be performed at a temperature of about 400° C. or more.

The protective layer 800 is formed of nonorganic SOD, such as HSQ, to prevent SiOC used in the interlayer insulating layers 510 and 550 from being damaged during a process of etching back the protective layer 800. The protective layer 800 is etched back to define the protective layer 800 in the via hole 710 for a photoresist pattern required in a subsequent etching process. This will be described in detail below.

The protective layer 800 may be formed of an organic material such as an antirefective coating (ARC) material. However, if the protective layer 800 is formed of the ARC material, several problems may occur. For example, since the ARC layer is seriously affected by the density of patterns, the thickness of the ARC layer may not be uniform. Also, if a process of etching back the ARC layer is performed to improve the uniformity of the ARC layer, the ARC layer may be etched back by a dry process using oxygen plasma. Thus, the interlayer insulating layers 510 and 550 formed of SiOC may be damaged by the oxygen plasma. However, in one embodiment of the present invention, the protective layer 800 is formed of nonorganic SOD, which can prevent the interlayer insulating layers 510 and 550 from being damaged.

Figure 9:
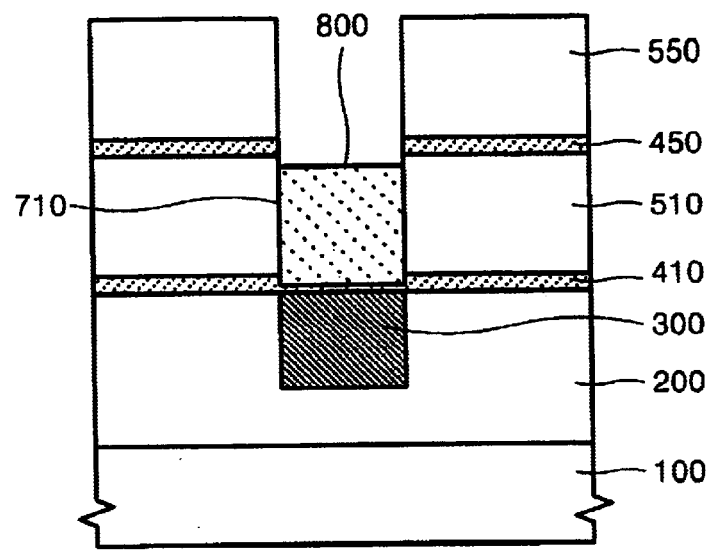

FIG. 9 shows the steps of etching back the protective layer 800 into the via hole 710. In detail, the protective layer 800 is etched back to be defined in the via hole 710. Thus, the upper surface of the protective layer 800 may be lower than the upper surface of the second interlayer insulating layer 550. The etch back is preferably performed by a wet etching method having an excellent etch selectivity to prevent the interlayer insulating layer 550 from being damaged during the etch back. For example, the etch back may be performed by a wet etching method using a developer such as a negative resist developer (NRD). Here, the NRD may include a tetramethyl ammonium hydroxide aqueous solution of about 2 wt %.

Figure 15:
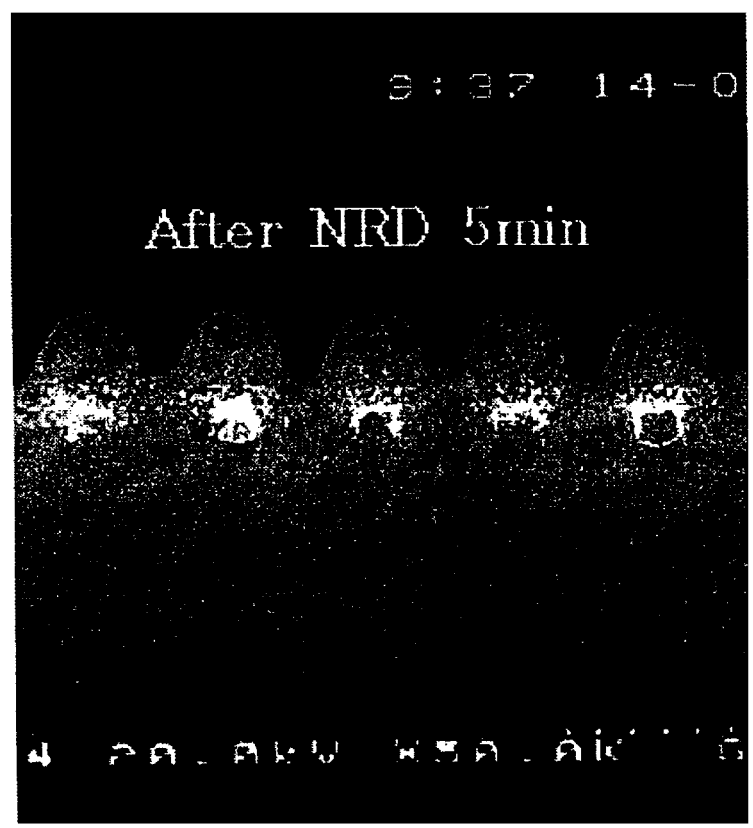
FIG. 15 is a scanning electron microscope image showing the profile of a nonorganic spin-on dielectric (SOD) layer etched back by a negative resist developer (NRD) and formed according to the embodiment of the present invention.

The protective layer 800 may be defined in the via hole 710 by an etch back using NRD. Thus, the upper surface of the protective layer 800 may be lower than the upper surface of the second interlayer insulating layer 550. Here, the etched back protective layer 800 which has a uniform remaining thickness may be advantageous. This can be confirmed in FIG. 15 showing the actual profile of the etched back protective layer 800. FIG. 15 is a scanning electron microscope image showing the profile of a nonorganic SOD layer, which is a HSQ layer, etched back by a NRD. As shown in FIG. 15, the HSQ layer used as the etched back protective layer 800 has a uniform thickness. This may be advantageous in a subsequent photolithography process.

The protective layer 800 may be etched back using an aqueous solution containing HF. The HSQ layer is etched to a thickness of about 470 Å for 90 seconds using a HF solution diluted with water at a ratio of 1:500, and SiOC, of which the interlayer insulating layers 510 and 550 are formed, is etched to a thickness of about 15–31 Å using the HF solution. Thus, the HF solution does not substantially damage the interlayer insulating layers 510 and 550 and thus, the protective layer 800 may be etched back. Here, since the etch rate of the HSQ layer by the HF solution is very high as described above, it is preferable that the dilution ratio of the HF solution to water is 1:500 or more to control the etch rate of the HSQ layer.

Figure 10:
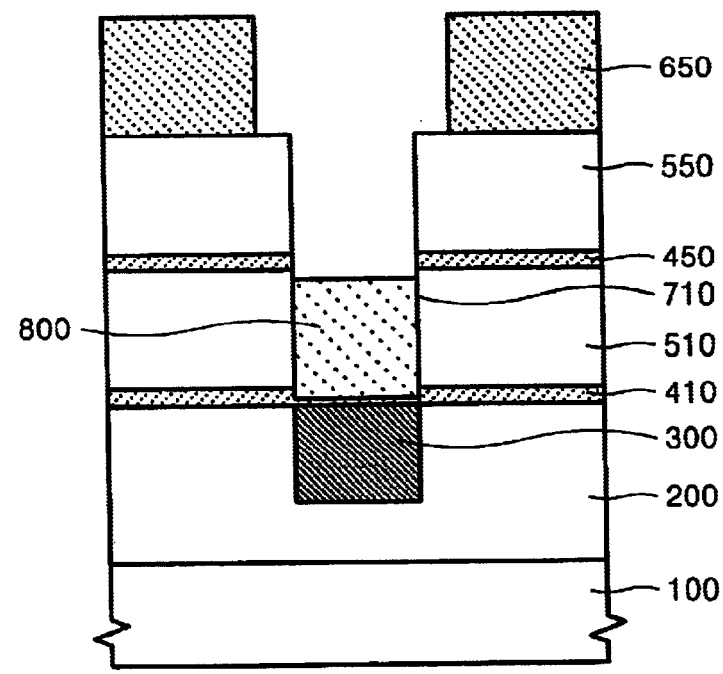

FIG. 10 shows the steps of forming a second etching mask 650 on the second interlayer insulating layer 550. In detail, the second etching mask 650, e.g., a photoresist pattern, is formed on the interlayer insulating layer 550 where the via hole 710 is formed. A region exposed by the second etching mask 650 is preferably wider than a region exposed by the first etching mask 610. The second etching mask 650 exposes a portion of the second interlayer insulating layer 550 including the edges and upper surface of the second interlayer insulating layer 550 adjacent to the via hole 710. Here, the portion exposed by the second etching mask 650 includes the via hole 710.

Figure 11:
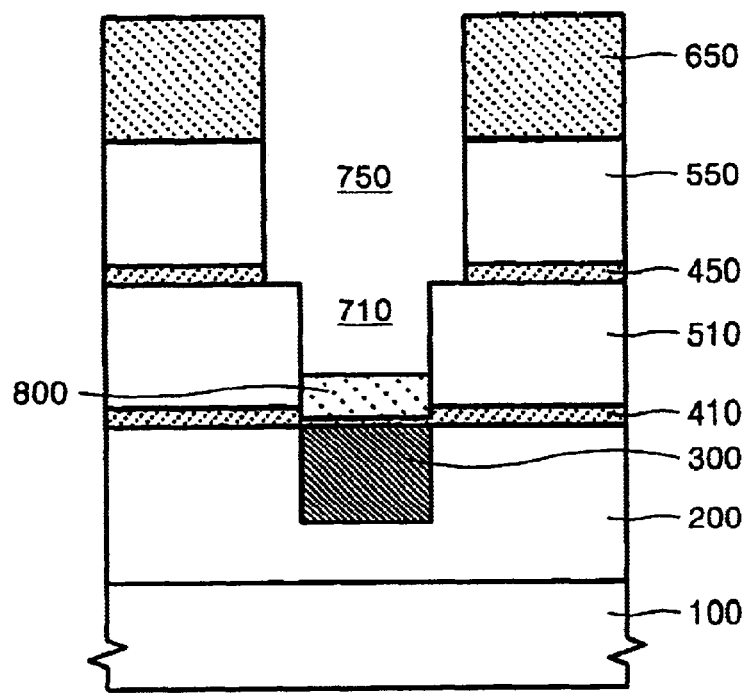

FIG. 11 shows the steps of etching a portion of the second interlayer insulating layer 550 exposed by the second etched mask 650 to form a trench 750. In detail, the portion of the second interlayer insulating layer exposed by the second etching mask 650 is etched to form a trench 750 connected to the via hole 710. It is preferable that the etching process of patterning the second interlayer insulating layer 550 uses the second etching stopper 450 as an etching stopping point. The etching process of forming the trench 750 is performed after the via hole 710 is formed, but does not remove the first etching stopper 410 since the protective layer 800 protects the first etching stopper 410. That is, the etching process may remove a portion of the protective layer 800 but does not entirely remove the first etching stopper 410 which is protected by the protective layer 800.

The etching process of forming the trench 750 may be performed by a dry etching method used for etching silicon oxide. For example, the via hole 710 may be formed by a dry etch method using a reaction gas containing a $C_xF_yH_z$-family gas (x, y, and z are arbitrary integers). Here, the reaction gas may further contain an oxygen gas ($O_2$), a nitrogen gas ($N_2$), and/or an argon gas (Ar).

The photoresist pattern used as the second etching mask 650 is removed. The photoresist pattern may be removed by ashing and stripping. Here, the lower conductive layer 300 is fully protected by the first etching stopper 410 or by the first etching stopper 410 and the remained protective layer 800 and thus is not exposed during ashing for removing the photoresist pattern. As a result, the lower conductive layer 300 is not damaged during ashing.

Figure 12:
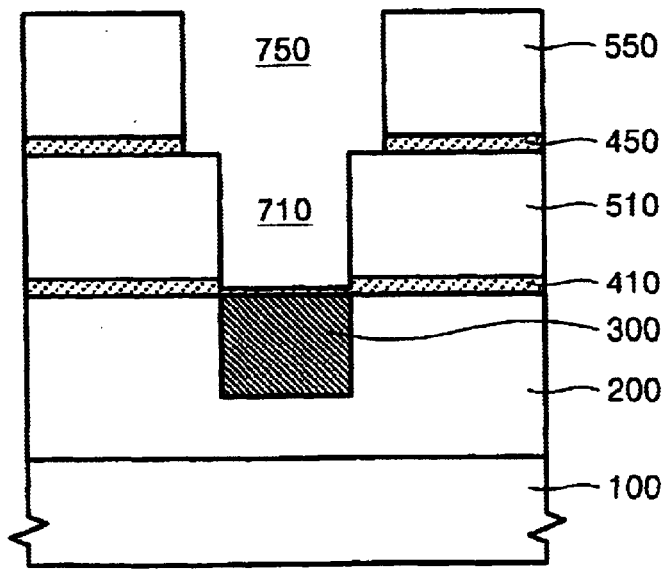

FIG. 12 shows the steps of removing the protective layer 800 still remaining. In detail, the protective layer 800 is removed using a solution containing HF. If a HSQ layer used as the protective layer 800 is stripped for 90 seconds using a HF solution diluted with water at a ratio of 1:500, the HSQ layer may be removed by a thickness of about 470 Å. In contrast, SiOC, of which the interlayer insulating layers 510 and 550 are formed, is only removed by a thickness of about 15–31 Å in 90 seconds using the HF solution diluted with water at a ratio of 1:500. Thus, the sidewalls of the via hole 710 and the trench 750 formed by the interlayer insulating layers 510 and 550 is not substantially damaged during a process of removing the HSQ layer adopted as the protective layer 800. SiC, of which the first etching stopper 410 may be formed, is only removed by a thickness of about 13 Å in 90 seconds using the HF solution diluted with water at a ratio of 1:500. Thus, the first etching stopper 410 may be minimumly removed during the process of removing the protective layer 800.

The protective layer 800 may be etched back by a wet etching method using a developer such as NRD. Here, NRD may contain a tetramethyl ammonium hydroxide aqueous solution of about 2 wt %. Since NRD selectively removes HSQ. which may be used as the protective layer 800 as showing in FIG. 15, NRD may be used to remove the remaining protective layer 800.

Figure 13:
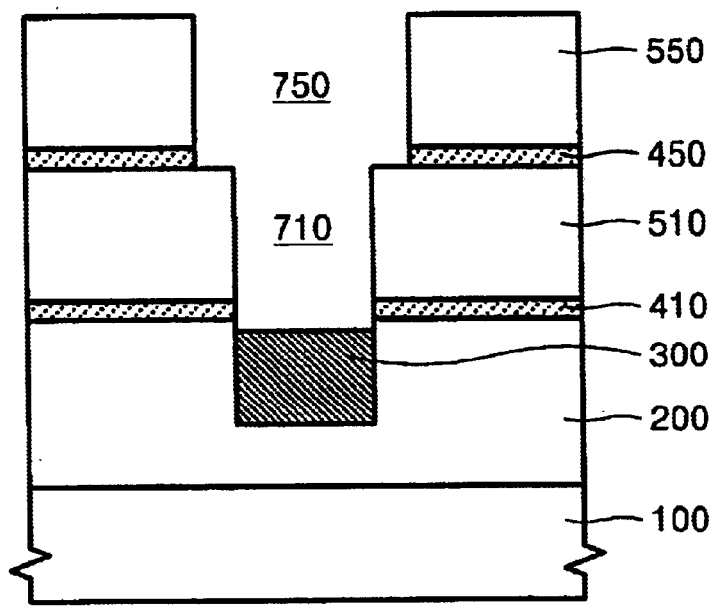

FIG. 13 shows the steps of removing a remaining portion of the first etching stopper 410 exposed at the bottom of the via hole 710. In detail, the remaining portion of the first etching stopper 410 at the bottom of the via hole 710 is removed to expose the upper surface of the lower conductive layer 300. The remaining portion of the first etching stopper 410 may be etched by a dry etching method. For example, the remaining portion of the first etching stopper 410 may be etched by a dry etching method using a reaction gas containing $C_xF_yH_z$-family gas (x, y, and z are arbitrary integers). Here, the reaction gas may further contain an oxygen gas ($O_2$), a nitrogen gas ($N_2$), and an argon gas (Ar).

The exposed upper surface of the lower conductive layer 300 is protected during the process of forming the trench 750 and the via hole 710 and thus is not damaged.

Figure 14:
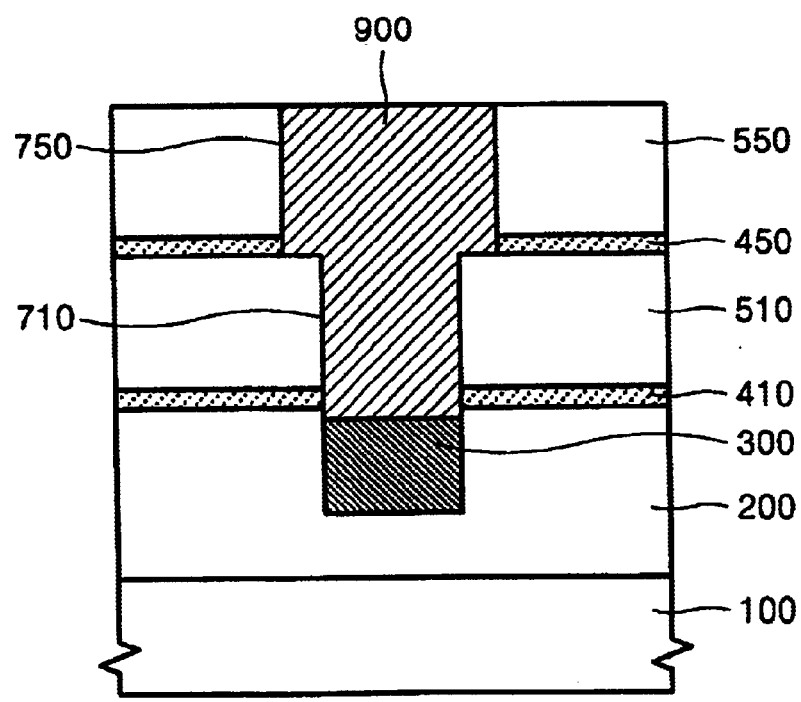

FIG. 14 shows the steps of forming an upper conductive layer 900 filling the via hole 710 and the trench 750. In detail, a conductive layer is formed on the second interlayer insulating layer 550 and then planarized to form the upper conductive layer 900 which fills the via hole 710 and the trench 750. The upper conductive layer 900 may be formed of a variety of conductive materials but is preferably formed of a material containing copper. The conductive layer may be planarized by etch back or chemical mechanical polishing (CMP).

The upper conductive layer 900 formed of copper is electrically connected to the lower conductive layer 300 to serve as an interconnection line. Here, the upper surface of the lower conductive layer 300 is free from damage as described above and thus can be electrically connected to the upper conductive layer.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of forming an interconnection line in a semiconductor device comprising:

forming a first etching stopper on a lower conductive layer which is formed on a semiconductor substrate;

forming a first interlayer insulating layer on the first etching stopper;

forming a second etching stopper on the first interlayer insulating layer;

forming a second interlayer insulating layer over the second etching stopper;

etching the second interlayer insulating layer, the second etching stopper and the first interlayer insulating layer sequentially using the first etching stopper as an etching stopping point to form a via hole aligned with the lower conductive layer;

forming a protective layer to protect a portion of the first etching stopper exposed at the bottom of the via hole, the protective layer filling the via hole and extending across the via hole;

etching the protective layer such that the protective layer remains only in the bottom of the via hole;

after etching the protective layer such that the protective layer remains only in the bottom of the via hole, forming an etching mask on the second interlayer insulating layer;

etching a portion of the second interlayer insulating layer adjacent to the via hole using the second etching stopper as an etching stopping point and the etching mask to form a trench connected to the via hole;

removing the protective layer;

removing the portion of the first etching stopper positioned at the bottom of the via hole; and forming an upper conductive layer that fills the via hole and the trench and is electrically connected to the lower conductive layer.

2. The method of claim 1, wherein the lower conductive layer includes a copper layer.

3. The method of claim 1, wherein the first etching stopper is formed of at least one of silicon nitride and silicon carbide.

4. The method of claim 1, wherein the first interlayer insulating layer is formed of a material having a low dielectric constant.

5. The method of claim 4, wherein the material having a low dielectric constant is carbon-doped silicon oxide (SiOC).

6. The method of claim 1, wherein the second etching stopper is formed of at least one of silicon nitride and silicon carbide.

7. The method of claim 1, wherein the second interlayer insulating layer is formed of a material having a low dielectric constant.

8. The method of claim 7, wherein the material having a low dielectric constant is carbon-doped silicon oxide (SiOC).

9. The method of claim 1, wherein the protective layer includes nonorgarnic spin-on dielectric (SOD).

10. The method of claim 9, wherein the nonorganic SOD is Hydrogen silsesQuioxane (HSQ).

11. The method of claim 1, wherein the step of forming the protective layer comprises:

forming the protective layer on the second interlayer insulating layer to fill the via hole; and etching back the protective layer so that the upper surface of the protective layer is lower than the upper surface of the second interlayer insulating layer.

12. The method of claim 11, wherein the etch back is performed by a wet etching method using a resist developer.

13. The method of claim 12, wherein the resist developer includes a tetramethyl ammonium hydroxide aqueous solution.

14. The method of claim 11, wherein the etch back is performed by a wet etching method using a HF solution diluted with water.

15. The method of claim 1, wherein the protective layer is removed by a wet etching method using a resist developer.

16. The method of claim 15, wherein the resist developer includes tetramethyl ammonium hydroxide aqueous solution.

17. The method of claim 1, wherein the protective layer is removed by a wet etching method using a HF solution diluted with water.

18. The method of claim 1, wherein the upper conductive layer includes a copper layer.

* * * * *